(12) United States Patent
Sathaiya et al.

(10) Patent No.: US 10,157,985 B2
(45) Date of Patent: Dec. 18, 2018

(54) MOSFET WITH SELECTIVE DOPANT DEACTIVATION UNDERNEATH GATE

(71) Applicant: TAIWAN SEMICONDUCTOR MANUFACTURING COMPANY, LTD., Hsinchu (TW)

(72) Inventors: Dhanyakumar Mahaveer Sathaiya, Hsinchu (TW); Kai-Chieh Yang, Zhubei (TW); Wei-Hao Wu, Hsinchu (TW); Ken-Ichi Goto, Hsinchu (TW); Zhiqiang Wu, Chubei (TW); Yuan-Chen Sun, Hsinchu (TW)

(73) Assignee: TAIWAN SEMICONDUCTOR MANUFACTURING COMPANY, LTD., Hsinchu (TW)

( * ) Notice: Subject to any disclaimer, the term of this patent is extended or adjusted under 35 U.S.C. 154(b) by 118 days.

(21) Appl. No.: 14/855,477

(22) Filed: Sep. 16, 2015

(65) Prior Publication Data

US 2016/0005817 A1 Jan. 7, 2016

Related U.S. Application Data

(62) Division of application No. 13/434,630, filed on Mar. 29, 2012, now Pat. No. 9,153,662.

(51) Int. Cl.
| | |
|---|---|
| *H01L 29/10* | (2006.01) |
| *H01L 29/66* | (2006.01) |
| *H01L 29/78* | (2006.01) |
| *H01L 29/16* | (2006.01) |
| *H01L 21/265* | (2006.01) |

(52) U.S. Cl.
CPC ...... *H01L 29/1041* (2013.01); *H01L 29/1045* (2013.01); *H01L 29/1608* (2013.01); *H01L 29/66537* (2013.01); *H01L 29/66651* (2013.01); *H01L 29/7833* (2013.01); *H01L 21/2658* (2013.01); *H01L 21/26506* (2013.01); *H01L 29/66545* (2013.01)

(58) Field of Classification Search
CPC ............. H01L 29/1045; H01L 29/1041; H01L 29/1608; H01L 29/7833; H01L 29/66651; H01L 29/66537; H01L 21/2658; H01L 21/26506; H01L 29/66545
See application file for complete search history.

(56) References Cited

U.S. PATENT DOCUMENTS

| | | | |
|---|---|---|---|
| 6,274,439 B1 | 8/2001 | Ito | |
| 6,849,527 B1 | 2/2005 | Xiang | |
| 8,598,007 B1* | 12/2013 | Flachowsky | ...... H01L 21/82341 438/275 |
| 2003/0227041 A1* | 12/2003 | Atwood | ................ G11C 11/405 257/296 |

(Continued)

*Primary Examiner* — Bilkis Jahan
(74) *Attorney, Agent, or Firm* — Hauptman Ham, LLP

(57) ABSTRACT

A metal-oxide-semiconductor field-effect transistor (MOSFET) device includes a channel region comprising dopants of a first type. The MOSFET device further includes a gate dielectric over the channel region, and a gate over the gate dielectric. The MOSFET device further includes a source comprising dopants of a second type, and a drain comprising dopants of the second type, wherein the channel region is between the source and the drain. The MOSFET device further includes a deactivated region underneath the gate, wherein dopants within the deactivated region are deactivated.

20 Claims, 10 Drawing Sheets

(56) References Cited

U.S. PATENT DOCUMENTS

| | | |
|---|---|---|
| 2005/0285212 A1* | 12/2005 | Tolchinsky ......... H01L 29/1054 257/408 |
| 2009/0011581 A1 | 1/2009 | Weber et al. |
| 2009/0085110 A1* | 4/2009 | Giles ................. H01L 21/26506 257/335 |
| 2009/0170339 A1 | 7/2009 | Trentzsch et al. |
| 2010/0164017 A1 | 7/2010 | Noda |
| 2012/0007194 A1* | 1/2012 | Sakakidani ....... H01L 21/26506 257/402 |
| 2013/0065371 A1 | 3/2013 | Wei et al. |

\* cited by examiner

MOSFET WITH SELECTIVE DOPANT DEACTIVATION UNDERNEATH GATE

PRIORITY CLAIM

The present application is a divisional of U.S. application Ser. No. 13/434,630, filed Mar. 29, 2012, which is incorporated herein by reference in its entirety.

RELATED APPLICATIONS

The present disclosure is related to U.S. application Ser. No. 13/288,201, entitled "Semiconductor Transistor Device with Optimized Dopant Profile" filed on Nov. 3, 2011, which is incorporated herein by reference.

TECHNICAL FIELD

The present disclosure relates generally to an integrated circuit and more particularly to a metal-oxide-semiconductor field-effect transistor (MOSFET).

BACKGROUND

Some MOSFET devices suffer from device variability issues, such as random dopant fluctuation (RDF) and threshold voltage variations. RDF depends on the device channel profile and the gate critical dimension variations are proportional to the threshold voltage roll-off slope. Reducing the RDF and threshold voltage roll-off slope will help reduce the total variability of the MOSFET device.

BRIEF DESCRIPTION OF THE DRAWINGS

Reference is now made to the following descriptions taken in conjunction with the accompanying drawings, in which.

DETAILED DESCRIPTION

Figure 1:
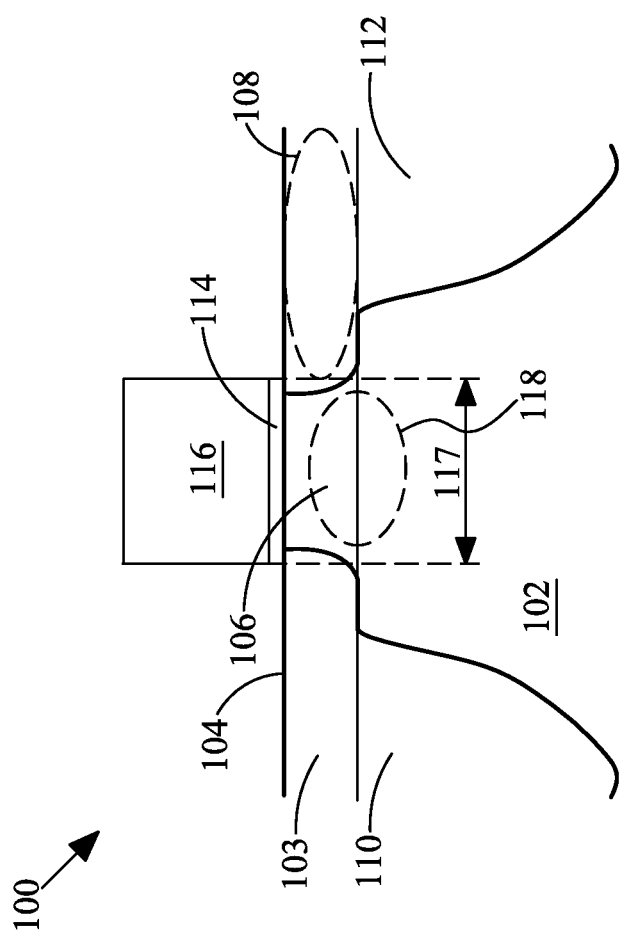
FIG. 1 is a cross section diagram of an exemplary MOSFET device with selective dopant deactivation in a region underneath the gate according to some embodiments.

The making and using of various embodiments are discussed in detail below. It should be appreciated, however, that the present disclosure provides many applicable inventive concepts that can be embodied in a wide variety of specific contexts. The specific embodiments discussed are merely illustrative of specific ways to make and use, and do not limit the scope of the disclosure.

In addition, the present disclosure may repeat reference numerals and/or letters in the various examples. This repetition is for the purpose of simplicity and clarity and does not in itself dictate a relationship between the various embodiments and/or configurations discussed. Moreover, the formation of a feature on, connected to, and/or coupled to another feature in the present disclosure that follows may include embodiments in which the features are formed in direct contact, and may also include embodiments in which additional features may be formed interposing the features, such that the features may not be in direct contact. In addition, spatially relative terms, for example, "lower," "upper," "horizontal," "vertical," "above," "below," "up," "down," "top," "bottom," etc. as well as derivatives thereof (e.g., "horizontally," "downwardly," "upwardly," etc.) are used for ease of the present disclosure of one features relationship to another feature. The spatially relative terms are intended to cover different orientations of the device including the features.

FIG. 1 is a cross section diagram of an exemplary MOSFET device with selective dopant deactivation in a region underneath the gate according to some embodiments. The MOSFET device 100 includes a substrate 102, an upper substrate layer 103, a channel region 106, a lightly doped drain (LDD) 108, a source 110, a drain 112, a gate dielectric 114, and a gate 116 having a gate length 117. The substrate 102 comprises silicon or any other suitable material. The upper substrate layer 103 can be part of the substrate 102, or comprise a separate epitaxial layer such as silicon epitaxial (Si-Epi) layer in some embodiments. The LDD 108 is optional, and doped with lower dopant dosage to permit a device operation with a higher drain-source voltage.

The gate dielectric 114 that is disposed over a substrate surface 104 comprises silicon dioxide, high-k dielectric, or any other suitable material. The high-k dielectric material such as hafnium oxide, hafnium silicate, zirconium silicate, or zirconium dioxide has a higher dielectric constant compared to silicon dioxide. The gate 116 comprises metal, polysilicon, or any other suitable material. The source 110 and the drain 112 are doped with dopants. Acceptors such as boron or Indium are used as dopants for P-type MOSFET (PMOS), and donors such as phosphorus, arsenic, antimony are used for N-type MOSFET (NMOS). The channel region 106 is doped with dopants different from the source 110 and the drain 112. For example, if the source 110 and the drain 112 are doped with N-type material (donors), the channel region 106 is doped with P-type material (acceptors).

In the MOSFET device 100, dopants in a region 118 underneath the gate 116 are selectively deactivated to reduce the active dopants in and/or around the channel region 106. One way to perform the selective deactivation in NMOS is to use localized carbon implant in the region 118 underneath the gate 116 (in the channel region 106). The region 118 underneath the gate 116 has a depth ranging from 5 nm to 40 nm below the gate dielectric 114 in some embodiments. For example, the selectively deactivated region 118 is located at a depth of about 20 nm beneath the substrate surface 104 in one embodiment. Another way is to create a substrate recess followed by forming an epitaxial layer (e.g., Si-Epi) in the channel region 106 to directly remove the active dopants of the channel region 106 as described in FIGS. 6A-6G.

In some embodiments, an NMOS device having boron doping in the channel region 106, carbon is implanted in the region 118 underneath the gate 116. The carbon implantation is performed with an energy ranging from 2 KeV to 25 KeV and a dose ranging from $5e13$ $cm^{-2}$ to $1e15$ $cm^{-2}$ in some examples.

Figure 2:
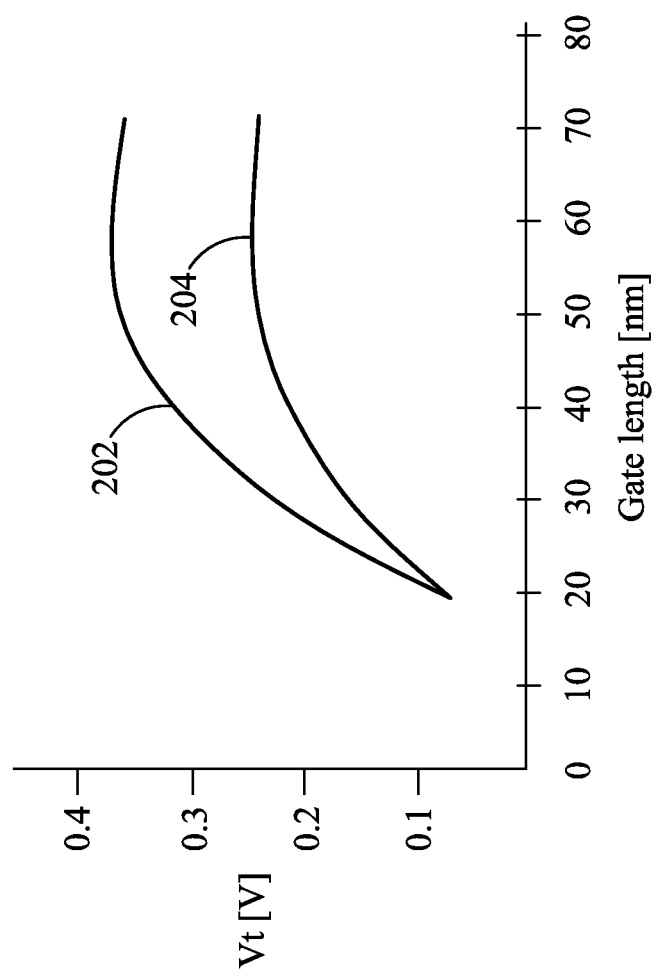
FIG. 2 is a plot showing threshold voltage (Vt) roll-off slope comparison of NMOS devices with and without the selective dopant deactivation according to some embodiments.

FIG. 2 is a plot showing threshold voltage (Vt) roll-off slope comparison of NMOS devices with and without the selective dopant deactivation according to some embodiments. A curve 202 is for an NMOS device without the selective dopant deactivation in the region 118 underneath the gate 116. A curve 204 is for an NMOS device having the selective dopant deactivation in the region 118 underneath the gate 116 as described above.

As the gate length 117 changes from 20 nm to 50 nm, the Vt changes about 0.3 V for the curve 202, and the Vt changes about 0.16 V for the curve 204. Compared to the Vt roll-off slope of the curve 202, the Vt roll-off slope of the curve 204 is significantly reduced. Since the selective deactivation region 118 is in the channel region 106, the deactivation has more Vt reduction for a long channel device compared to short channel device.

Figure 3:
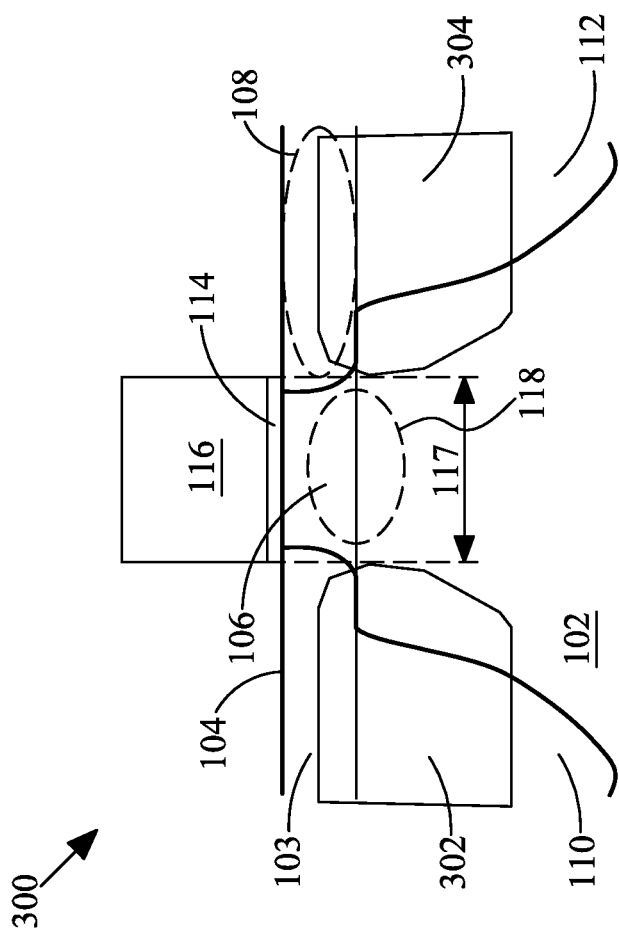
FIG. 3 is a cross section diagram of an exemplary MOSFET device with selective dopant deactivation in a region underneath the gate and halo implant.

FIG. 3 is a cross section diagram of an exemplary MOSFET device 300 with selective dopant deactivation in a region 118 (underneath the gate 116) and halo implants 302 and 304. In the MOSFET device 300, further Vt roll-off slope improvement is achieved with halo implants 302 and 304 (e.g., using Indium or Boron for NMOS and arsenic or phosphorus for PMOS) in addition to the selective deactivation in the region 118 underneath the gate 116. The halo implant is a low energy/current implantation carried out at large incident angle so that implanted dopants penetrate underneath the edge of the gate 116. In one embodiment, indium halo implants 302 and 304 increases Vt of a short channel NMOS device 300.

Figure 4:
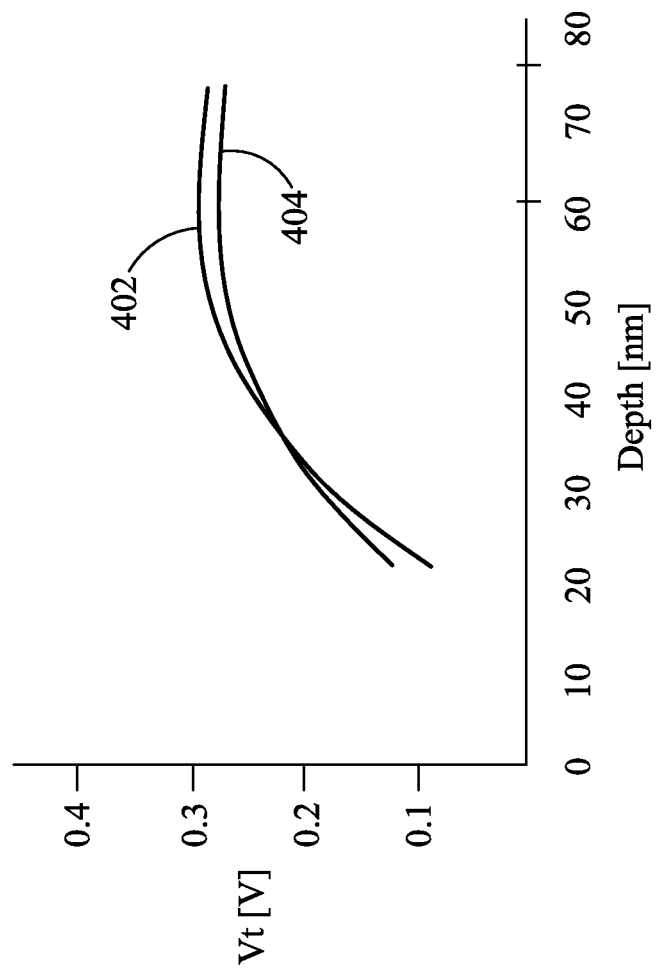
FIG. 4 is a plot showing Vt roll-off slope comparison of NMOS devices having the selective dopant deactivation with and without the halo implant.

FIG. 4 is a plot showing Vt roll-off slope comparison of NMOS devices having the selective dopant deactivation with and without the halo implant. A curve 402 is for an NMOS with carbon implant in the region 118 underneath the gate 116 for selective deactivation but without halo implants 302 and 304. A curve 404 is for an NMOS with carbon implant for selective deactivation and halo implants 302 and 304. As the gate length 117 changes from 20 nm to 50 nm, the Vt changes about 0.2 V for the curve 402, and the Vt changes about 0.13 V for the curve 404. The curve 404 shows reduced Vt roll-off slope compared to the curve 402.

Figure 5A:
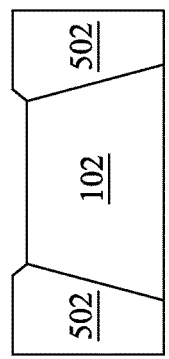
FIGS. 5A-5G are schematic diagrams of intermediate steps of an exemplary fabrication process of a MOSFET device according to some embodiments.

FIGS. 5A-5G are schematic diagrams of intermediate steps of an exemplary fabrication process of a MOSFET device according to some embodiments. FIG. 5A shows a substrate 102 with shallow trench isolation (STI) 502. The substrate 102 comprises silicon or any other suitable material. The STI 502 is formed by etching trenches in the substrate 102, depositing one or more dielectric materials (such as silicon dioxide) to fill the trenches, and removing the excess dielectric using a technique such as chemical-mechanical planarization (CMP).

Dopants are implanted for a Vt/well implant operation over the substrate 102, particularly in where the channel region (106 in FIG. 1) will be formed. The dopants can be P-type dopants such as boron or other suitable species, or N-type dopants such as phosphorous, antimony, or arsenic, according to various embodiments.

As will be referred to hereinafter, the Vt implant introduces dopants of a first dopant type (either N-type or P-type). The Vt implant may use an implant energy of 5 KeV to 30 KeV for NMOS (P-type Vt implant such as $BF_2$) and 50 KeV to 130 KeV for PMOS (N-type Vt implant such as Arsenic) in some embodiments. Various suitable implantation powers and energies may be used. The Vt implant introduces impurities into the channel region to adjust the Vt (threshold voltage) applied to the device to open the channel to current flow and may also be referred to as a Vt adjust implant. An annealing operation that may be used to activate the introduced dopants, cure crystalline defects and cause diffusion and redistribution of dopants. Various annealing operations may be used and the annealing operations may drive the implanted dopants deeper into the substrate 102.

Figure 5B:
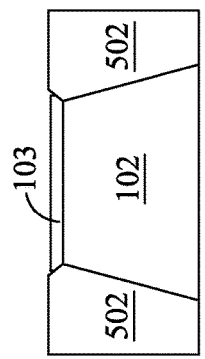

In FIG. 5B, an optional silicon epitaxial (Si-Epi) layer 103 is formed over the substrate 102 using epitaxial deposition or other suitable methods. The Si-Epi layer 103 is undoped and has a thickness of about 5 nm-20 nm in various embodiments. In one example, the Si-Epi layer 103 has a thickness of about 8 nm. In some embodiments, an undoped SiC layer (not shown) may be also epitaxially deposited between the substrate 102 and the Si-Epi layer 103 and may have a thickness of about 2 nm-20 nm in various embodiments. The Silicon carbide (SiC) retards dopant diffusion.

Figure 5C:
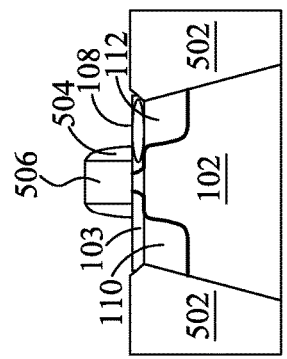

In FIG. 5C, a dummy gate 506 is formed, which may use any known methods in the art or later developed methods. A dummy gate dielectric (not shown) may be also formed below the dummy gate 506 in some embodiments. The dummy gate 506 comprises polysilicon or any other suitable material. Various patterning techniques may be used to pattern the dummy gate 506. With the dummy gate 506 in place, optional LDD and/or halo implant operations can be carried out. In some embodiments, LDD 108 is formed in the drain 112 area by lightly doping. Also, halo implants (e.g., 302 and 304 in FIG. 3, not shown in FIG. 5C for simplicity) can be performed in the source 110 area and drain 112 area.

Each of the LDD 108 and halo implant operations introduces dopants through upper surface of the Si-Epi layer 103 and/or the substrate 102. The LDD 108 is formed of a second dopant type, opposite the first dopant type of the Vt implant in FIG. 5A. According to one embodiment, the LDD 108 region may be N-type with the Vt implant operation being P-type. A halo implantation operation is an angled ion implantation process and can use any suitable method known in the art. The halo implantation operation introduces dopants of the same dopant type, as the Vt implantation into the source 110 area and the drain 112 area, but not the channel region (below the dummy gate 506).

According to one embodiment, the halo implantation operation may introduce P-type dopants although N-type dopants may be implanted in other embodiments. In one embodiment, the halo implantation operation may be used to introduce a mixture of indium and carbon, and in another embodiment, the halo implantation operation may be used to introduce indium and boron, such as present in $BF_2$.

Spacers 504 are formed using various methods known in the art and comprise oxide silicon nitride or any other suitable material. The source 110 and drain 112 are formed by source/drain implantation operation. The source 110 and drain 112 are formed of the same, second dopant type as LDD 108. In one embodiment, LDD 108 and source 110/drain 112 are N-type regions, for example.

Figure 5E:
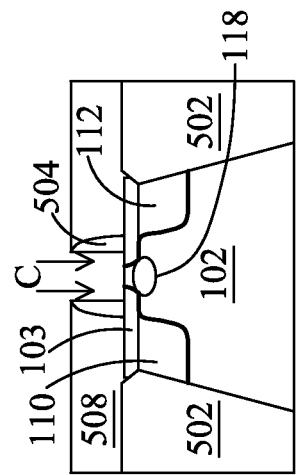
Figure 5D:
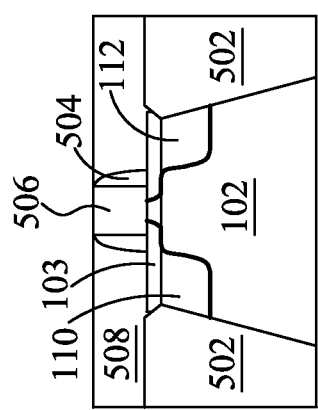

In FIG. 5D, inter layer dielectric (ILD) 508 is formed over the Si-Epi 103 layer and/or the substrate 102 by depositing any suitable dielectric material and planarization, for example.

In FIG. 5E, the dummy (polysilicon) gate 506 is removed by etching, for example. Carbon implant operation is performed to selectively deactivate dopants in the region 118 underneath the gate 116 (in the channel region). In some embodiments, an NMOS device having boron doping in the channel region, carbon is implanted in the region 118 underneath the gate 116 with an energy ranging from 2 KeV to 25 KeV and a dose ranging from 5e13 $cm^{-2}$ to 1e15 $cm^{-2}$. An annealing operation may be performed to cure crystalline defects and cause diffusion and redistribution of carbon implants.

Figure 5G:
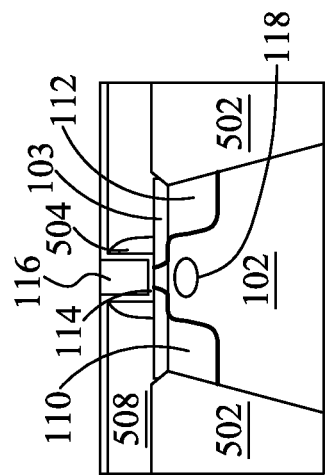
Figure 5F:
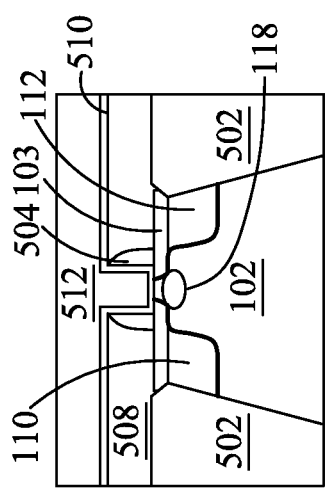

In FIG. 5F, a gate dielectric layer 510, e.g., a high-k dielectric, is formed over the surface of the Si-Epi layer 103 and/or the substrate 102. The gate dielectric layer 510 may be formed using various suitable dielectric deposition processes. According to one embodiment, hafnium oxide (HfO) may be used, but other suitable dielectric materials may be used for the gate dielectric layer 510 in other embodiments. The gate dielectric layer 510 using a high-k dielectric has a thickness of 2 nm in one embodiment, but may have a thickness that ranges from about 1 nm to 20 nm in various embodiments.

A metal gate layer 512 is formed over the gate dielectric layer 510 by depositing any suitable metal using conventional or later developed methods. Various patterning techniques may be used to pattern the metal gate layer 512 and the gate dielectric layer 510.

In FIG. 5G, a gate stack including a gate dielectric 114 and gate 116 is formed over the Si-Epi layer 103 and/or the substrate 102. The gate 116 comprises metal in this example, but may comprise polysilicon or any other suitable materials in other embodiments. By the process in FIGS. 5A-5G, a selective dopant deactivation is performed in the region 118 underneath the gate 116, e.g., by carbon implant on boron doped channel, and the Vt roll-off slope is reduced, which helps to reduce local device variability.

Figure 6A:
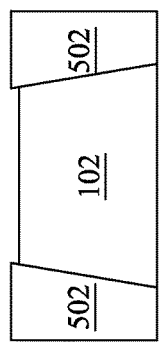
FIGS. 6A-6G are schematic diagrams of intermediate steps of another exemplary fabrication process of a MOSFET device according to some embodiments.

FIGS. 6A-6G are schematic diagrams of intermediate steps of another exemplary fabrication process of a MOSFET device according to some embodiments. FIG. 6A shows a substrate 102 with shallow trench isolation (STI) 502. The step in FIG. 6A is similar to the step in FIG. 5A. The substrate 102 comprises silicon or any other suitable material. The STI 502 is formed by etching trenches in the substrate 102, depositing one or more dielectric materials (such as silicon dioxide) to fill the trenches, and removing the excess dielectric using a technique such as chemical-mechanical planarization (CMP).

Dopants are implanted for a Vt/well implant operation over the substrate 102, particularly in where the channel region (106 in FIG. 1) will be formed. The Vt implant introduces dopants of a first dopant type (either N-type or P-type) and is a lower power implant. An annealing operation that may be used to activate the introduced dopants, cure crystalline defects and cause diffusion and redistribution of dopants. Various annealing operations may be used and the annealing operations may drive the implanted dopants deeper into the substrate 102.

Figure 6B:
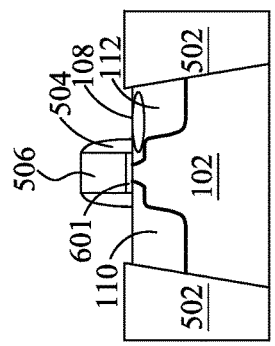

In FIG. 6B, a dummy gate 506 and a dummy gate dielectric 601 are formed over the substrate 102, which may use any known methods in the art or later developed methods. The dummy gate 506 comprises polysilicon or any other suitable material. Various patterning techniques may be used to pattern the dummy gate 506. With the dummy gate 506 in place, optional LDD and/or halo implant operations can be carried out. In some embodiments, LDD 108 is formed in the drain 112 area by lightly doping. Also, halo implants (e.g., 302 and 304 in FIG. 3, not shown in FIG. 6B for simplicity) can be performed in the source 110 area and drain 112 area.

Each of the LDD 108 and halo implant operations introduces dopants through upper surface of the substrate 102. The LDD 108 is formed of a second dopant type, opposite the first dopant type of the Vt implant in FIG. 6A. According to one embodiment, the LDD 108 region may be N-type with the Vt implant operation being P-type. A halo implantation operation is an angled ion implantation process and can use any suitable method known in the art. The halo implantation operation introduces dopants of the same dopant type as the Vt implantation into the source 110 area and the drain 112 area, but not the channel region at the center (below the dummy gate 506).

According to one embodiment, the halo implantation operation may introduce P-type dopants although N-type dopants may be implanted in other embodiments. In one embodiment, the halo implantation operation may be used to introduce a mixture of indium and carbon, and in another embodiment, the halo implantation operation may be used to introduce indium and boron, such as present in $BF_2$.

Spacers 504 are formed using various methods known in the art and comprise oxide silicon nitride or any other suitable material. The source 110 and drain 112 are formed by source/drain implantation operation. The source 110 and drain 112 are formed of the same, second dopant type as LDD108. In one embodiment, the LDD 108 and source 110/drain 112 are N-type regions, for example.

Figure 6C:
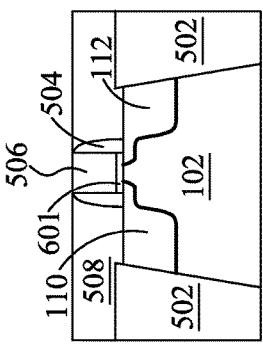

In FIG. 6C, inter layer dielectric (ILD) 508 is formed over the substrate 102 by depositing any suitable dielectric material and planarization, for example.

Figure 6E:
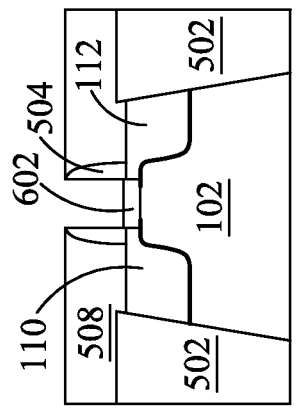
Figure 6D:
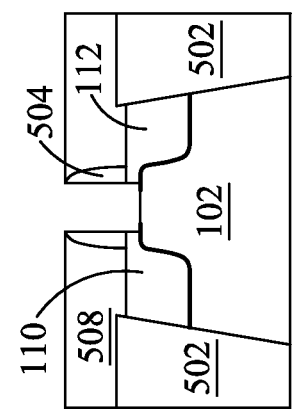

In FIG. 6D, the dummy gate 506, the dummy gate dielectric 601, and upper surface of the substrate 102 located between spacers 504 are removed to form a recess on the substrate 102 surface between the spacers 504 by etching, for example.

In FIG. 6E, a silicon epitaxial (Si-Epi) layer 602 is formed in the recess area over the substrate 102 located between the spacers 504, using epitaxial deposition or other suitable methods. The Si-Epi layer 602 is undoped and has a thickness of about 5 nm-40 nm in various embodiments. In some embodiments, an undoped SiC layer (not shown) may be also epitaxially deposited between the substrate 102 and the Si-Epi layer 601 and may have a thickness of about 2 nm-20 nm in various embodiments. The Silicon carbide (SiC) retards dopant diffusion.

Figure 6G:
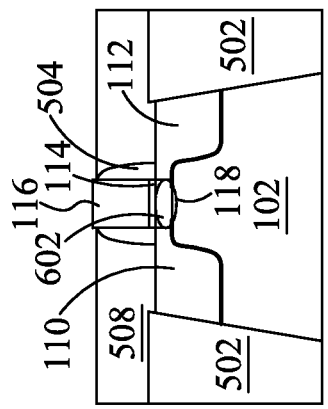
Figure 6F:
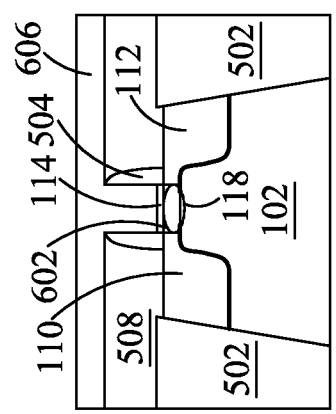

In FIG. 6F, a gate dielectric 114, e.g., a high-k dielectric, is formed over the surface of the Si-Epi layer 602. The gate dielectric 114 may be formed using various suitable dielectric deposition processes. According to one embodiment, hafnium oxide (HfO) may be used, but other suitable dielectric materials may be used for the gate dielectric 114 in other embodiments. The gate dielectric 114 using a high-k dielectric has a thickness of 2 nm in one embodiment, but may have a thickness that ranges from about 1 nm to 20 nm in various other embodiments.

A metal gate layer 606 is formed over the gate dielectric 114 by depositing any suitable metal using conventional or later developed methods. Various patterning techniques may be used to pattern the metal gate layer 606 and the gate dielectric 114.

In FIG. 6G, a gate stack including the gate dielectric 114 and a gate 116 is defined by removing excess metal gate layer 606, e.g., using CMP. The gate 116 comprises metal in this example, but may comprise polysilicon or any other suitable materials in other embodiments. By the process in FIGS. 6A-6G, a selective dopant deactivation is performed in the region 118 underneath the gate 116, e.g., by replacing the doped upper substrate portion in the channel region (between spacers 504) with an undoped Si-Epi layer 602, and the Vt roll-off slope is reduced, which helps to reduce local device variability.

One aspect of this description relates to a metal-oxide-semiconductor field-effect transistor (MOSFET) device. The MOSFET device includes a channel region comprising dopants of a first type. The MOSFET device further includes a gate dielectric over the channel region, and a gate over the gate dielectric. The MOSFET device further includes a source comprising dopants of a second type, and a drain comprising dopants of the second type, wherein the channel region is between the source and the drain. The MOSFET device further includes a deactivated region underneath the gate, wherein dopants within the deactivated region are deactivated.

Another aspect of this description relates to a metal-oxide-semiconductor field-effect transistor (MOSFET) device. The MOSFET device includes a substrate, and an epitaxial layer over the substrate. The MOSFET device further includes a channel region comprising dopants of a first type, wherein the channel is at least partially within the epitaxial layer. The MOSFET includes a gate structure over the channel region. The MOSFET further includes a source comprising dopants of a second type, and a drain comprising dopants of the second type, wherein the channel region is between the source and the drain. The MOSFET further includes a deactivated region in the channel region underneath the gate, wherein the deactivated region comprises carbon.

Still another aspect of this description relates to a metal-oxide-semiconductor field-effect transistor (MOSFET) device. The MOSFET device includes a substrate, and a channel region comprising dopants of a first type. The MOSFET device further includes a gate structure over the channel region. The MOSFET device further includes a source comprising dopants of a second type, and a drain comprising dopants of the second type, wherein the channel region is between the source and the drain. The MOSFET device further includes a deactivated region in the channel region underneath the gate, wherein the deactivated region comprises an epitaxial layer.

A skilled person in the art will appreciate that there can be many embodiment variations of this disclosure. Although the embodiments and their features have been described in detail, it should be understood that various changes, substitutions and alterations can be made herein without departing from the spirit and scope of the embodiments. Moreover, the scope of the present application is not intended to be limited to the particular embodiments of the process, machine, manufacture, and composition of matter, means, methods and steps described in the specification. As one of ordinary skill in the art will readily appreciate from the disclosed embodiments, processes, machines, manufacture, compositions of matter, means, methods, or steps, presently existing or later to be developed, that perform substantially the same function or achieve substantially the same result as the corresponding embodiments described herein may be utilized according to the present disclosure.

The above method embodiment shows exemplary steps, but they are not necessarily required to be performed in the order shown. Steps may be added, replaced, changed order, and/or eliminated as appropriate, in accordance with the spirit and scope of embodiment of the disclosure. Embodiments that combine different claims and/or different embodiments are within the scope of the disclosure and will be apparent to those skilled in the art after reviewing this disclosure.

What is claimed is:

1. A metal-oxide-semiconductor field-effect transistor (MOSFET) device comprising:
   a channel region comprising dopants of a first type;
   a gate dielectric over the channel region;
   a gate over the gate dielectric;
   a source comprising dopants of a second type;
   a drain comprising dopants of the second type, wherein the channel region is between the source and the drain; and
   a deactivated region underneath the gate and at least partially within the channel region, wherein dopants within the deactivated region are deactivated, and the deactivated region comprises carbon and is physically separated from both the source and the drain by a portion of a substrate that is free of carbon.

2. The MOSFET device of claim 1, wherein the carbon is located at a depth ranging from 5 nm to 40 nm below the gate dielectric.

3. The MOSFET device of claim 1, further comprising halo implants in the source and the drain.

4. The MOSFET device of claim 1, wherein the MOSFET device is an N-type device, the first type of dopants is P-type, and the second type of dopants is N-type.

5. The MOSFET device of claim 1, wherein the gate comprises metal and the gate dielectric comprises a high-k dielectric.

6. The MOSFET device of claim 1, wherein the deactivated region comprises an undoped epitaxial layer.

7. The MOSFET device of claim 6, wherein the undoped epitaxial layer comprises silicon.

8. A metal-oxide-semiconductor field-effect transistor (MOSFET) device comprising:
   a substrate;
   an epitaxial layer over the substrate;
   a channel region comprising dopants of a first type, wherein the channel is at least partially within the epitaxial layer;
   a gate structure over the channel region;
   a source comprising dopants of a second type;
   a drain comprising dopants of the second type, wherein the channel region is between the source and the drain; and
   a deactivated region in the channel region underneath the gate structure, wherein the deactivated region comprises carbon, and the deactivated region extends from inside the epitaxial layer into the substrate outside the epitaxial layer.

9. The MOSFET device of claim 8, wherein the gate structure comprises spacers, and the deactivated region is in a portion of the channel region defined by the spacers.

10. The MOSFET device of claim 9, wherein the deactivated region comprises an undoped silicon epitaxial layer.

11. The MOSFET device of claim 10, wherein the deactivated region comprises a silicon carbide (SiC) epitaxial layer.

12. The MOSFET device of claim 11, wherein the SiC epitaxial layer is between the undoped silicon epitaxial layer and the substrate.

13. The MOSFET device of claim 8, further comprising halo implant regions in the substrate, wherein the halo implant regions extend under the gate structure.

14. The MOSFET device of claim 13, wherein the halo implant regions extend into the epitaxial layer.

15. A metal-oxide-semiconductor field-effect transistor (MOSFET) device comprising:
   a substrate;
   a channel region comprising dopants of a first type;
   a gate structure over the channel region;
   a source comprising dopants of a second type;
   a drain comprising dopants of the second type, wherein the channel region is between the source and the drain; and a deactivated region in the channel region underneath the gate structure, wherein the deactivated region comprises a first region inside an epitaxial layer and a second region outside the epitaxial layer.

16. The MOSFET device of claim 15, wherein the epitaxial layer comprises:
a silicon carbide (SiC) layer over the substrate; and
an un-doped silicon layer over the SiC layer.

17. The MOSFET device of claim 15, further comprising halo implant regions in the substrate extending under the gate structure.

18. The MOSFET device of claim 17, wherein the halo implant regions comprise indium or boron.

19. The MOSFET device of claim 17, wherein the halo implant regions comprise arsenic or phosphorous.

20. The MOSFET device of claim 1, further comprising a dielectric layer over the substrate and surrounding the gate.

* * * * *